(12) United States Patent
Tang et al.

(10) Patent No.: US 7,378,873 B1
(45) Date of Patent: May 27, 2008

(54) PROGRAMMABLE LOGIC DEVICE PROVIDING A SERIAL PERIPHERAL INTERFACE

(75) Inventors: Howard Tang, San Jose, CA (US); Om P. Agrawal, Los Altos, CA (US); David L. Rutledge, Hillsboro, OR (US); Fabiano Fontana, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 42 days.

(21) Appl. No.: 11/446,548

(22) Filed: Jun. 2, 2006

(51) Int. Cl.
*H01L 25/00* (2006.01)
*H03K 19/177* (2006.01)
(52) U.S. Cl. .............................. 326/41; 326/38; 326/40
(58) Field of Classification Search ............. 326/38–41
See application file for complete search history.

(56) References Cited

U.S. PATENT DOCUMENTS

| | | | |
|---|---|---|---|
| 5,548,228 | A | 8/1996 | Madurawe |
| 5,640,107 | A | 6/1997 | Kruse |
| 5,689,516 | A | 11/1997 | Mack et al. |
| 5,696,455 | A | 12/1997 | Madurawe |
| 5,794,033 | A | 8/1998 | Aldebert |
| 6,038,185 | A | 3/2000 | Ng |
| 6,044,025 | A | 3/2000 | Lawman |
| 6,049,222 | A | 4/2000 | Lawman |
| 6,150,837 | A | 11/2000 | Beal et al. |
| 6,304,099 | B1 | 10/2001 | Tang et al. |
| 6,356,107 | B1 | 3/2002 | Tang et al. |
| 6,467,009 | B1 | 10/2002 | Winegarden et al. |
| 6,483,342 | B2 | 11/2002 | Britton et al. |
| 6,507,214 | B1 | 1/2003 | Snyder |
| 6,538,468 | B1 | 3/2003 | Moore |
| 6,564,285 | B1 | 5/2003 | Mills |
| 6,704,850 | B1 | 3/2004 | Reynolds |
| 6,714,041 | B1 | 3/2004 | Darling et al. |
| 6,721,840 | B1 | 4/2004 | Allegrucci |
| 6,732,263 | B1 | 5/2004 | May et al. |
| 6,772,230 | B2 | 8/2004 | Chen et al. |
| 6,774,668 | B1 | 8/2004 | Wirtz, II |
| 6,785,165 | B2 | 8/2004 | Kawahara |
| 6,828,823 | B1 | 12/2004 | Tsui et al. |
| 6,851,047 | B1 | 12/2004 | Tsui et al. |

(Continued)

OTHER PUBLICATIONS

Serial Peripheral Interface Bus—Wikipedia, the free enclyclopedia, Jan. 6, 2007, p. 1-7.

(Continued)

*Primary Examiner*—Anh Q. Tran
(74) *Attorney, Agent, or Firm*—MacPherson Kwok Chen & Heid LLP; Brent A. Folsom

(57) ABSTRACT

Systems and methods are disclosed herein to provide an improved approach to the configuration of integrated circuits such as programmable logic devices (PLDs). For example, in accordance with one embodiment of the present invention, a PLD includes volatile memory adapted to store configuration data to configure the PLD for its intended function. The PLD further includes non-volatile memory adapted to store configuration data which is transferable to the volatile memory to configure the PLD for its intended function. The PLD further includes a serial peripheral interface (SPI) port adapted to receive configuration data from an external device for transfer into one of the volatile memory and the non-volatile memory.

20 Claims, 5 Drawing Sheets

U.S. PATENT DOCUMENTS

| | | |
|---|---|---|
| 6,873,177 B1 | 3/2005 | Wennekamp et al. |
| 6,903,574 B2 | 6/2005 | Chen et al. |
| 7,081,771 B2 | 7/2006 | Agrawal et al. |
| 7,088,132 B1 | 8/2006 | Tang et al. |
| 7,095,247 B1 | 8/2006 | Tang et al. |
| 7,190,190 B1 * | 3/2007 | Camarota et al. ............ 326/38 |
| 2004/0061147 A1 | 4/2004 | Fujita |
| 2004/0064622 A1 | 4/2004 | Smith |
| 2005/0189962 A1 | 9/2005 | Agrawal et al. |
| 2006/0119384 A1 * | 6/2006 | Camarota et al. ............ 326/38 |

OTHER PUBLICATIONS

"Low-Cost FPGA Configuration Via Industry-Standard SPI Serial Flash & LatticeECP/EC EPGAs," White Paper, Jun. 2004, Lattice Semiconductor Corporation.

AT17LV(A) Series FPGA Configuration Memory , Ref. 0437K-CNFG-May 2003, pp. 1-18, ATMEL Corporation.

FPGA Configuration EEPROM Memory, 2322F-CNFG, Jun. 2006, pp. 1-18, ATMEL Corporation.

FPGA Configuration EEPROM Memory, 2321E-CNFG, Jun. 2003, pp. 1-24, ATMEL Corporation.

Lattice Semiconductor Corporation, MachXO Family Data Sheet, Version 02.1, May 2006, pp. 1-93.

Altera® Section III User Flash Memory, Max II Device Handbook, vol. 1, 2005, 80 pages, no month.

Actel ProAsic® 3 Flash Family FPGAs with Optional Soft ARM® Support, Advanced v0.6, Apr. 2006, 208 pages.

Altera Corporation, Cyclone Device Handbook, vol. 1, 13, Configuring Cyclone FPGAs, Aug. 2005, 50 pages.

Lattice Semiconductor Corporation, Low-Cost FPGA Configuration Via Industry-Standard SPI Serial Flash, A Lattice Semiconductor White Paper, Jun. 2004, 13 pages.

Xilinx®, Configuring Spartan-3E Xinlnx FPGAs with SPI Flash Memories, Arthur Khu, Jan. 3, 2006, 16 pages.

ST Microelectronics, M25P80, 8 Mbit, Low Voltage, Serial Flash Memory With 40 MHz SPI Bus Interface, Aug. 2004, 41 pages.

U.S. Appl. No. 11/397,985, Fontana.

U.S. Appl. No. 11/398,437, Tang.

U.S. Appl. No. 11/446,309, Tang.

U.S. Appl. No. 11/293,941, Tang.

U.S. Appl. No. 11/350,436, Tang et al.

U.S. Appl. No. 11/348,817, Chen et al.

Lattice Semiconductor Corporation, ispXP Configuration Usage Guidelines, Technical Notes TN1026, Aug. 2002, pp. 1-18.

Lattice Semiconductor Corporation, ispXPGA™ Family, Data Sheet, Jul. 2005, 115 pages.

Lattice Semiconductor Corporation, ispXPGA™ Family, Preliminary Data Sheet, Dec. 2002, pp. 1-90.

Lattice Semiconductor Corporation, LatticeXP Family Data Sheet, Version 01.0, Feb. 2005, 77 pages.

Altera, MAX II Device Handbook, http://www.altera.com, M115V1-1.7, 330 pages, date N/A.

Xilinx, On the Fly Reconfiguration with CoolRunner-II CPLDs, Application Note: CoolRunner-II CPLDs, May 15, 2003, pp. 1-10.

Actel Corporation, "ProASIO Plus Flash Family FPGAs", v.5.3 May 2006, 173 pages.

Actel Corporation, ProASIC3 Flash Family FPGAs, ARM7 Soft IP Support in ProASIC3E ARM7-Ready Devices, Oct. 2005, 166 pages.

* cited by examiner

PROGRAMMABLE LOGIC DEVICE PROVIDING A SERIAL PERIPHERAL INTERFACE

TECHNICAL FIELD

The present invention relates generally to integrated circuits and, more particularly, to configuration of programmable logic devices.

BACKGROUND

Programmable logic devices (PLDs), such as field programmable gate arrays (FPGAs) or complex programmable logic devices (CPLDs), may be programmed with configuration data to provide various user-defined features. For example, it is often desirable for users to program PLDs with particular input/output (I/O) functionality to support communication and interfacing of the PLDs with other devices as may be desired. As a result, significant numbers of user-programmable I/O pins may be needed to support such user-defined functionality in particular applications.

Unfortunately, certain conventional PLDs may use large numbers of I/O pins to implement manufacturer-specific programming interfaces to support the programming of the PLDs with configuration data from external computing devices. For example, such programming interfaces may be used to program non-volatile memory of a PLD with configuration data to support non-volatile storage and internal transfer to the PLD's configuration memory.

Nevertheless, such programming interfaces often require the use of dedicated I/O pins. Because of the limited number of pins available on a given PLD, the use of dedicated programming interface pins can significantly reduce the number of I/O pins available for user-defined operation. Moreover, existing PLDs that may support more simplified programming interfaces with lower pin counts typically do not provide convenient ways to selectively boot from various available sources of configuration data (e.g., such as from internal non-volatile memory), or they require use of interfaces that may not conveniently interface with external non-volatile memories (e.g., a JTAG interface). Accordingly, there is a need for an improved approach to the configuration of PLDs that, for example, provides users with ample I/O pins and permits configuration of the PLD to be performed through a convenient programming interface.

SUMMARY

In accordance with one embodiment of the present invention, a programmable logic device (PLD) includes volatile memory adapted to store configuration data to configure the PLD for its intended function; non-volatile memory adapted to store configuration data which is transferable to the volatile memory to configure the PLD for its intended function; and a serial peripheral interface (SPI) port adapted to receive configuration data from an external device for transfer into one of the volatile memory and the non-volatile memory.

In accordance with another embodiment of the present invention, a method of configuring a programmable logic device includes providing a serial peripheral interface (SPI) port adapted to receive configuration data from an external device; providing non-volatile memory adapted to receive the configuration data from the SPI port and store the configuration data; and providing volatile memory adapted to receive the configuration data from one of the SPI port and the non-volatile memory and to configure the programmable logic device for its intended function based on the configuration data.

In accordance with another embodiment of the present invention, a programmable logic device (PLD) includes volatile memory adapted to store configuration data to configure the PLD for its intended function; non-volatile memory adapted to store configuration data; means for receiving configuration data from an external serial peripheral interface (SPI) device; and means for transferring received configuration data into one of the volatile memory and the non-volatile memory.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

The various techniques disclosed herein are applicable to a wide variety of integrated circuits and applications. As an exemplary implementation, a programmable logic device (PLD) will be utilized to illustrate the techniques in accordance with one or more embodiments of the present invention. However, it should be understood that this is not limiting and that the techniques disclosed herein may be implemented as desired, in accordance with one or more embodiments of the present invention, within various types of integrated circuits.

Figure 1:
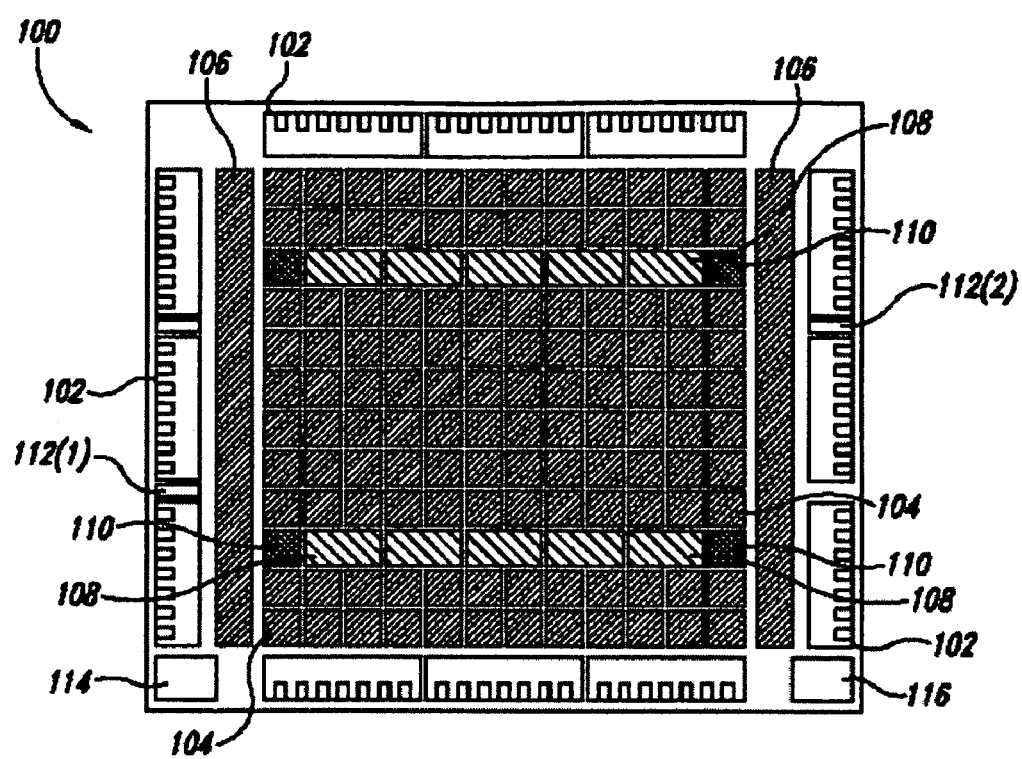
FIG. 1 shows a block diagram illustrating an exemplary programmable logic device in accordance with an embodiment of the present invention.

FIG. 1 shows a block diagram illustrating an exemplary programmable logic device (PLD) 100 in accordance with an embodiment of the present invention. PLD 100 (e.g., an FPGA) includes I/O blocks 102 and programmable logic blocks 104. I/O blocks 102 provide I/O functionality (e.g., to support one or more I/O and/or memory interface standards) for PLD 100. Programmable logic blocks 104 (e.g., also referred to in the art as configurable logic blocks or logic array blocks) provide logic functionality for PLD 100, such as for example LUT-based logic typically associated with FPGAs.

PLD 100 may also include reprogrammable non-volatile memory 106 (e.g., blocks of EEPROM or flash memory), volatile memory 108 (e.g., block SRAM), clock-related circuitry 110 (e.g., PLL circuits), one or more data ports 112, configuration memory 114, and/or an interconnect 116. It should be understood that the number and placement of the various elements, such as I/O blocks 102, logic blocks 104, non-volatile memory 106, volatile memory 108, clock-related circuitry 110, data port 112, configuration memory 114, and interconnect 116, is not limiting and may depend upon the desired application. Furthermore, it should be understood that the elements are illustrated in block form for clarity and that certain elements, such as configuration memory 114 and interconnect 116, would typically be distributed throughout PLD 100, such as for example in and between logic blocks 104, to perform their conventional functions (e.g., storing configuration data that configures PLD 100 and providing routing resources, respectively).

Data ports 112 are also provided which may be used for programming PLD 100. For example, data port 112(1) may represent a serial peripheral interface (SPI) port. As understood by those skilled in the art, SPI is a serial interface standard established by Motorola Corporation of Schaumburg, Ill. Data port 112(2) may represent, for example, a joint test action group (JTAG) port employing standards such as Institute of Electrical and Electronics Engineers (IEEE) 1149.1 and/or IEEE 1532 standards. Data ports 112(1) and 112(2) are not both required, but one or the other or both may be included to receive configuration data and commands. PLD 100 may also include additional data ports such as, for example, a CPU port.

Non-volatile memory 106 may be used to store configuration data within PLD 100 for transfer to configuration memory 114 of PLD 100 upon power up or during reconfiguration of PLD 100. This may drastically reduce the time to reconfigure PLD 100 relative to an external bitstream (e.g., reduce the time from seconds to microseconds for loading of configuration data into configuration memory 114).

Non-volatile memory 106 may also be used to provide background programming and/or storage for PLD 100 in accordance with some embodiments of the present invention. For example, for storage functionality, non-volatile memory 106 may be used as non-volatile storage for a user or manufacturer to store various test data, system management information, manufacturing control information, failure statistics information for board level diagnostics, security bits, identification codes, identification code selection bits (e.g., one or more custom ID fuses), and/or other information as desired.

For example, for background programming, PLD 100 may remain in user mode, based on the configuration data stored in configuration memory 114 within PLD 100, while non-volatile memory 106 is programmed with new configuration data (e.g., a new user defined pattern). Once the new configuration data is stored in non-volatile memory 106, this data can be transferred from non-volatile memory 106 to configuration memory 114 to reconfigure PLD 100, a process sometimes referred to as refresh. The refresh process can be initiated by a signal or instruction provided to one of data ports 112 (e.g., sending an SPI-compliant instruction via data port 112(1) or providing a JTAG refresh instruction via data port 112(2)).

Figure 2:
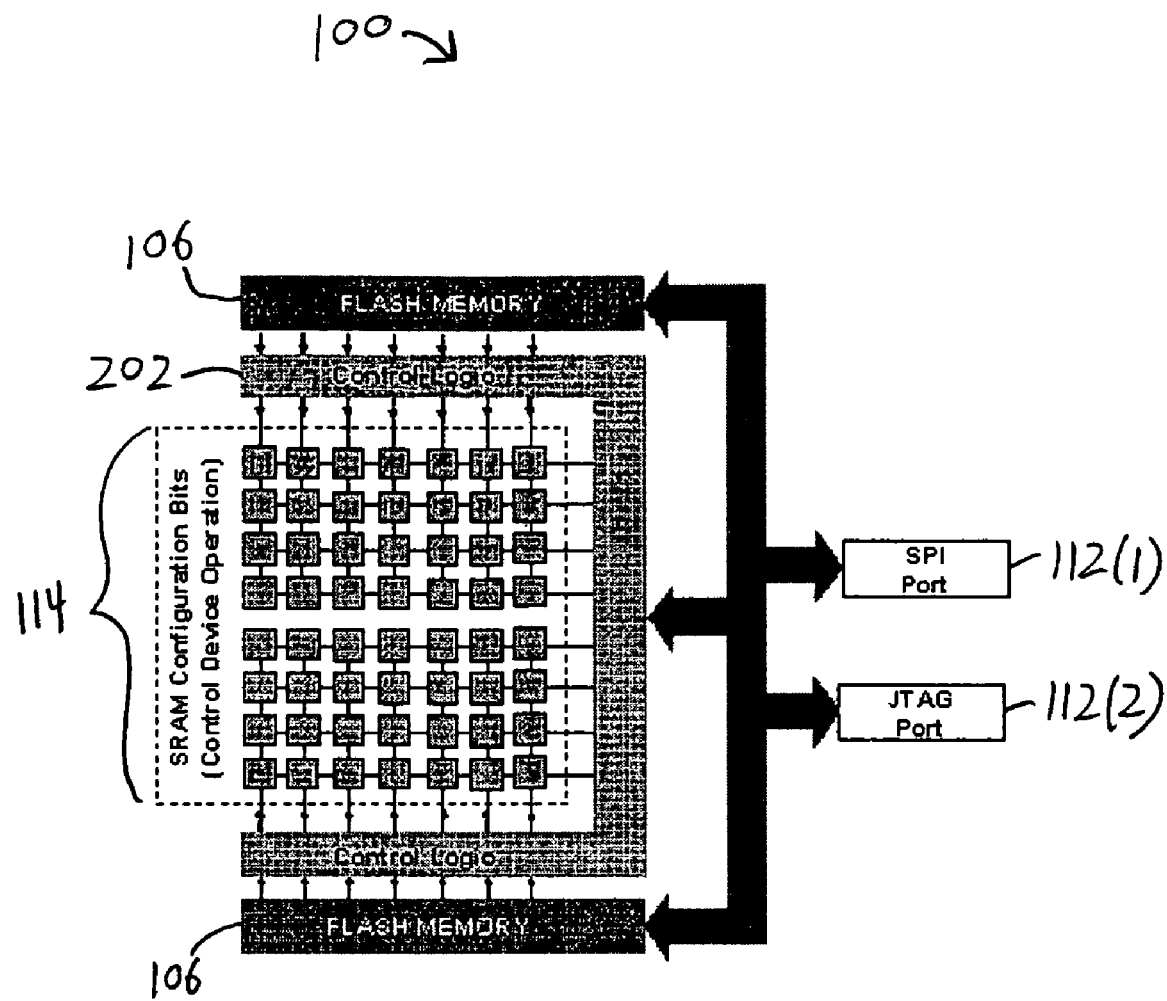
FIG. 2 shows a block diagram illustrating exemplary implementation details for a non-volatile memory and configuration memory of the programmable logic device of FIG. 1 in accordance with an embodiment of the present invention.

As a specific example, FIG. 2 shows a block diagram illustrating additional exemplary implementation details for PLD 100 of FIG. 1 in accordance with an embodiment of the present invention. As illustrated, PLD 100 includes configuration memory 114, non-volatile memory 106 (e.g., flash memory), and data ports 112 previously described in FIG. 1, and further includes control logic 202.

Configuration memory 114 (e.g., volatile SRAM cells or other types of volatile or non-volatile memory) are used in a conventional manner to store configuration data, which determines the user defined functions of PLD 100 (e.g., determines programmable functions of I/O blocks 102, logic blocks 104, and interconnect 116). Control logic 202 controls the internal transfer (for example, a massively parallel data transfer) of the configuration data from non-volatile memory 106 to configuration memory 114, as well as from data ports 112 to non-volatile memory 106 and configuration memory 114, as would be understood by one skilled in the art. Control logic 202 may represent core logic of PLD 100 such as FPGA-based logic circuits (e.g., lookup tables) or dedicated circuits.

It should be understood that flash memory represents an exemplary type of memory for non-volatile memory 106 which may be further implemented with appropriate security features. However, other types of non-volatile memory (e.g., EECMOS) that can be reprogrammed once or repeatedly may be substituted for non-volatile memory 106. Furthermore for example in accordance with one or more embodiments of the present invention, either non-volatile memory 106 or configuration memory 114 may be programmed (i.e., receive and store information in its memory) to store configuration data for PLD 100, but the device functionality of PLD 100 is determined by the information stored in configuration memory 114. Thus, PLD 100 may be configured (including reconfiguration or partial reconfiguration), for example, when information is programmed into configuration memory 114.

It should also be understood, in accordance with one or more embodiments of the present invention, that non-volatile memory 106 and configuration memory 114 may each be programmed (including reprogrammed), for example, via data port 112(1) or data port 112(2), depending upon the desired application or design requirements. Further details regarding programming may be found in U.S. Pat. No. 6,828,823 and U.S. Patent Publication No. 20050189962A1, published Sep. 1, 2005.

Figure 3:
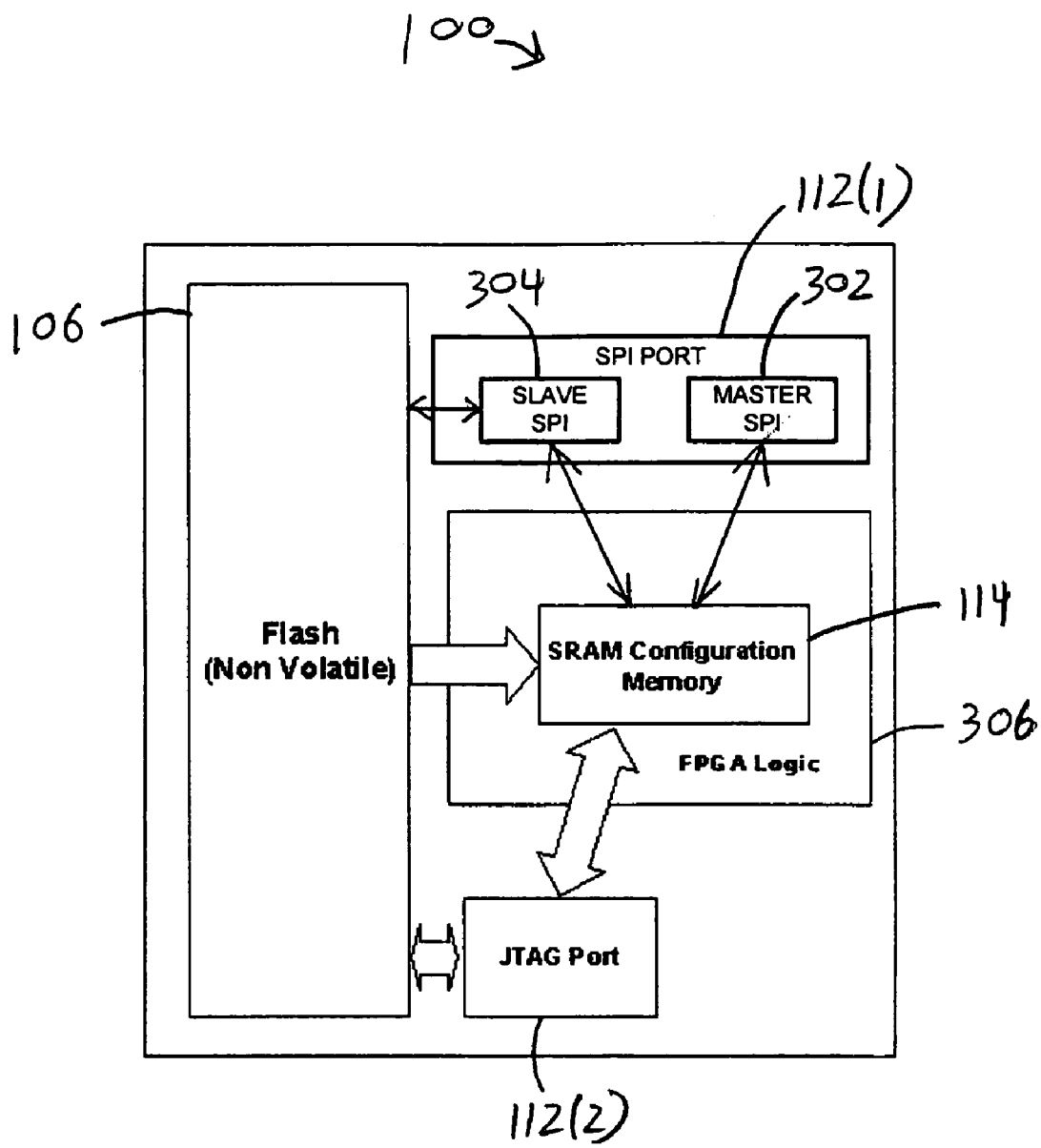
FIG. 3 shows a block diagram illustrating programming options of the programmable logic device of FIG. 1 in accordance with an embodiment of the present invention.

FIG. 3 shows a block diagram illustrating programming options of PLD 100 in accordance with an embodiment of the present invention. As illustrated, PLD 100 includes configuration memory 114, non-volatile memory 106 (e.g., flash memory), and data ports 112 previously described in FIGS. 1 and 2. PLD 100 further includes FPGA logic 306 which represents logic blocks 104 and other configurable aspects of PLD 100.

As also previously described in FIG. 1, data port 112(1) may be implemented as an SPI port and data port 112(2) may be implemented as a JTAG port. In this regard, it will be appreciated that data port 112(1) may operate in a master mode (i.e., sending a synchronizing clock signal to an external SPI-compatible device) or in a slave mode (i.e., receiving a synchronizing clock signal from an external SPI-compatible device). Accordingly, PLD 100 further includes master and slave SPI interface blocks 302 and 304, respectively, which may be implemented by control logic 202 of FIG. 2 to support data port 112(1) implemented as an SPI port. Control logic 202 may further support the implementation of data port 112(2) as a JTAG port.

In one embodiment, SPI port 112(1), master SPI interface block 302, and/or slave SPI interface block 304 may be implemented by one or more dedicated circuits. In another embodiment, SPI port 112(1), master SPI interface block 302, and/or slave SPI interface block 304 may be implemented by configurable logic (for example, programmable logic blocks 104) of PLD 100 to provide an SPI port.

As shown in FIG. 3, nonvolatile memory 106 and configuration memory 114 may each be programmed via data port 112(1) and data port 112(2). In particular, data port 112(1) (e.g., SPI port) may program configuration memory 114 through master SPI interface block 302, and may program and read back non-volatile memory 106 or configuration memory 114 through slave SPI interface block 304. Slave SPI interface block 304 may also be used to cause configuration data stored in non-volatile memory 106 to be copied into configuration memory 114 in response to a refresh command. Data port 112(2) (e.g., JTAG port) may program non-volatile memory 106 or configuration memory 114.

In general, programming non-volatile memory 106 may take longer (e.g., seconds) than programming configuration memory 114 (e.g., milliseconds). However, after non-volatile memory 106 has been programmed with suitable configuration data, non-volatile memory 106 can be employed to program configuration memory 114 much faster (e.g., microseconds) than would generally be possible via data ports 112 to provide essentially an instant-on capability (e.g., programming configuration memory 114 or logic blocks 104 approximately 200 microseconds after power-up). Non-volatile memory 106 may also be programmed while PLD 100 is operating (e.g., background or transparent operation), with configuration data from non-volatile memory 106 being transferred to configuration memory 114 when desired to reconfigure PLD 100.

PLD 100 offers certain advantages over various conventional PLDs which may lack non-volatile memory 106, configuration memory 114, and SPI interface support through data port 112(1). For example, by incorporating both non-volatile memory 106 and volatile configuration memory 114, PLD 100 can store configuration data in non-volatile memory 106 and not need external configuration devices that are required for SRAM only-based PLDs, while configuration memory 114 allows for infinite reconfigurability of PLD 100 that is generally not possible with non-volatile memory only-based PLDs (e.g., flash or EECMOS memory). In addition, both non-volatile memory 106 and configuration memory 114 (e.g., volatile memory) may be upgraded (i.e., programmed) via data ports 112 having low pin counts (e.g., an SPI port and/or a JTAG port). This contrasts with conventional non-volatile memory-based PLDs which may not allow programming of both volatile and non-volatile memories through such ports and may consequently necessitate programming through a manufacturer-specific programming port requiring a large number of dedicated I/O pins.

Accordingly, in accordance with one or more embodiments of the present invention, PLD 100 provides an essentially instant-on, remotely upgradeable, non-volatile, and dynamically reconfigurable device (e.g., integrated circuit) with the ability to program non-volatile memory 106 or configuration memory 114 directly, for example, via an SPI interface or a JTAG interface. Moreover, it will be appreciated that the implementation of an SPI port in particular can facilitate convenient interfacing with external SPI-compatible devices, such as non-volatile memories.

Figure 4:
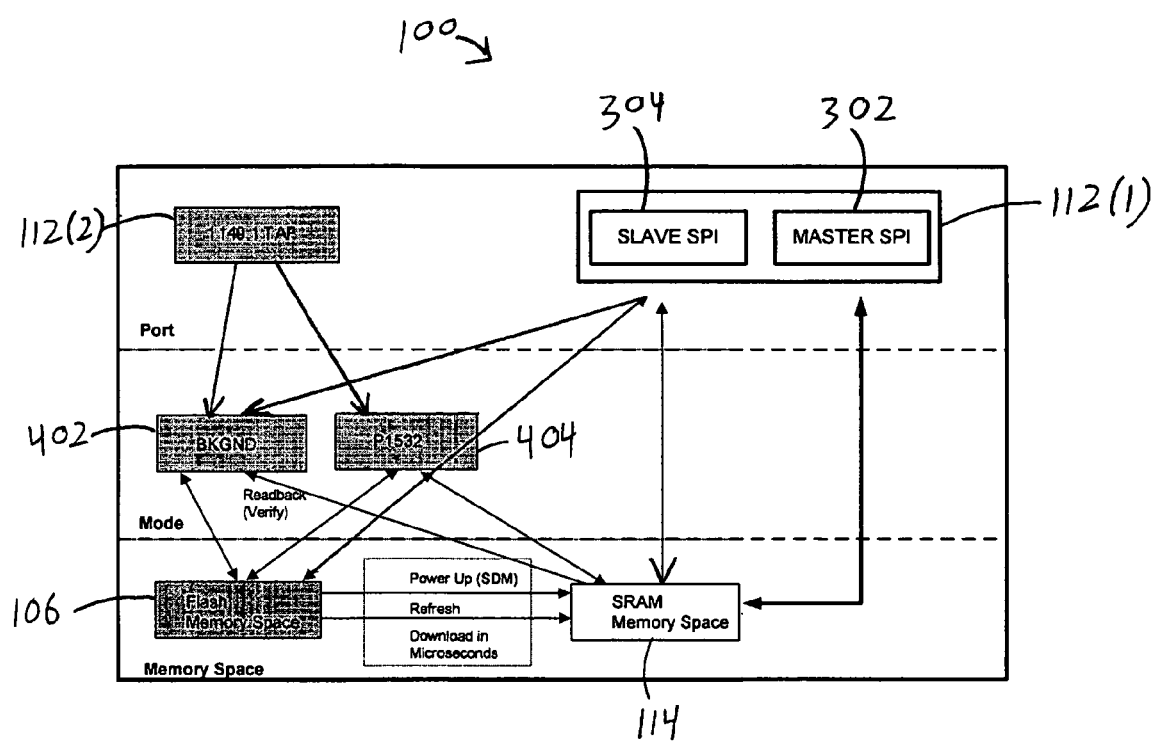
FIG. 4 shows a block diagram illustrating exemplary implementation details of data ports of the programmable logic device of FIG. 1 in accordance with an embodiment of the present invention.

FIG. 4 shows a block diagram illustrating exemplary implementation details of data ports 112 of PLD 100 in accordance with an embodiment of the present invention. In particular, data port 112(1) (e.g., SPI port) and data port 112(2) (e.g., JTAG port) are provided, which are used to provide external data (i.e., information, which may include control signals, configuration data, security bits, or other types of data) to non-volatile memory 106 (labeled Flash Memory Space) and configuration memory 114 (labeled SRAM Memory Space). As also shown in FIG. 4, multiple techniques are provided to program and configure the memory spaces of PLD 100.

For example, non-volatile memory 106 and configuration memory 114 may be programmed via data port 112(1). As previously discussed, data port 112(1) may be implemented as a SPI port supported by master SPI interface block 302 and slave SPI interface block 304. When data port 112(1) is operated in master mode, master SPI interface block 302 can be used to interface data port 112(1) with configuration memory 114 for programming. When data port 112(1) is operated in slave mode, slave SPI interface block 304 can be used to interface data port 112(1) for programming directly with non-volatile memory 106 or configuration memory 114. In this mode, slave SPI interface block 304 can also program non-volatile memory 106 through a background mode (BKGND) 402 for programming while PLD 100 continues to perform its system logic functions that are controlled or configured by configuration memory 114 (i.e., programming of non-volatile memory 106 is transparent to the device's logic operations).

Non-volatile memory 106 and configuration memory 114 may also be programmed via data port 112(2). For example, data port 112(2) (e.g. a JTAG port) may be implemented as an IEEE 1149.1 compliant test access port (TAP) and used to program non-volatile memory 106 or configuration memory 114 to allow in-system programmability or programming through a device-programmer system. Appropriate programming algorithms and circuitry may be designed to be fully IEEE 1532 compliant to allow programming via an IEEE 1532 programming mode 404, which allows for universal support from general automated test equipment (ATE) and other types of test systems. Data port 112(2) may also be used to program non-volatile memory 106 in background mode 402.

After non-volatile memory 106 or configuration memory 114 is programmed, a standard verify cycle may be performed by either of data ports 112. For example, background mode 402 or IEEE 1532 programming mode 404 may be used to read back the configuration data stored in non-volatile memory 106 or configuration memory 114 to ensure or verify that the configuration data has been properly loaded.

Figure 5:
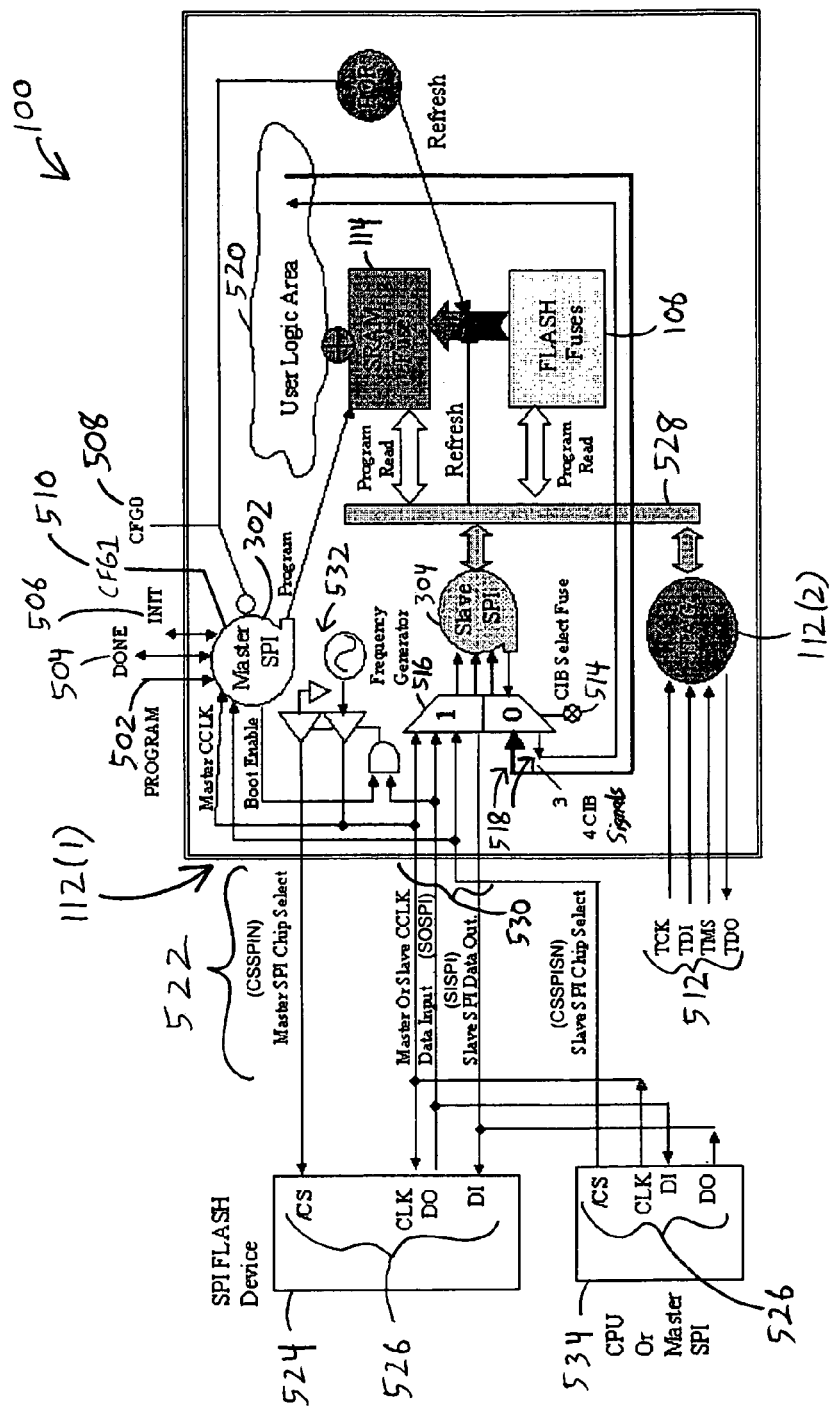
FIG. 5 shows a block diagram illustrating further exemplary implementation details of data ports of the programmable logic device of FIG. 1 in accordance with an embodiment of the present invention.

FIG. 5 shows a block diagram illustrating further exemplary implementation details of data ports 112 of PLD 100 in accordance with an embodiment of the present invention. As illustrated, data port 112(1) may be implemented to support a plurality of pins 522 (labeled CSSPIN, CCLK, SOSPI, CSSPISN, and SISPI) for interfacing PLD 100 with one or more external devices, such as an external non-volatile memory 524 (e.g., an SPI serial flash memory) and a CPU or master SPI device 534. In this regard, it will be appreciated that various pins 522 of data port 112(1) may be connected with conventional SPI pins 526 of external non-volatile memory 524 or CPU or master SPI device 534. In addition, data port 112(2) may be implemented to support a plurality of pins 512 (labeled TCK, TDI, TMS, and TDO) for interfacing PLD 100 with external devices supporting JTAG interfaces.

As further illustrated in FIG. 5, the CCLK and SOSPI pins are connected with additional clock/logic circuitry 532, and the CCLK pin is further connected with master SPI interface block 302. The CSSPISN pin is also connected with master SPI interface block 302 and may optionally be used to disable master SPI interface block 302 when data port 112(1) is operated in slave mode in order to avoid contention between master SPI interface block 302 and slave SPI interface block 304.

A subset 530 of pins 522 may connect with slave SPI interface block 304 through a multiplexer 516. Slave SPI interface block 304 is also connected with a common interface block (CIB) 528 of PLD 100 to facilitate the interfacing of pins 530 with non-volatile memory 106 and/or configuration memory 114. As illustrated, data port 112(2) may also connect with CIB 528 to facilitate the interfacing of pins 512 with non-volatile memory 106 and/or configuration memory 114.

A CIB select fuse 514 may be programmed to select between signals provided at pins 530 and a set of common interface block (CIB) signals 518. For example, in one embodiment, if CIB select fuse 514 corresponds to a first logic state (e.g., an unprogrammed state), multiplexer 516 will be switched to provide slave SPI interface block 304 with signals provided at pins 530 to provide an SPI port operating in slave mode.

If CIB select fuse 514 corresponds to a second logic state (e.g., a programmed state), multiplexer 516 will be switched to provide slave SPI interface block 304 with CIB signals 518 which may control SPI interface block 304 in a manner determined by user-defined logic 520. Advantageously, by operating slave SPI interface block 304 through CIB signals 518, user-defined logic 520 may utilize slave SPI interface block 304 to program, read, and refresh non-volatile memory 106 and/or configuration memory 114.

As shown below in Table 1, the specific behavior of pins 522 can depend upon whether data port 112(1) operates in master mode or slave mode.

PLD 100 further includes a PROGRAM pin 502, a DONE pin 504, and an INIT pin 506, each of which is connected with master SPI interface block 302. PROGRAM pin 502 can be used to trigger master SPI interface block 302 to reboot PLD 100 and therefore cause configuration data to be loaded from external non-volatile memory 524 into configuration memory 114 or from non-volatile memory 106 into configuration memory 114. DONE pin 504 indicates whether a refresh operation (i.e., a loading of configuration data into configuration memory 114) has been performed. INIT pin 506 indicates whether such a refresh operation is successful.

Advantageously, PLD 100 can be configured to boot from non-volatile memory 106 or external non-volatile memory 524 interfaced with data port 112(1). For example, in one embodiment, PLD 100 may further include a configuration pin 508 (labeled CFG0) which may be used to determine the response of PLD 100 to a power-on reset operation. For example, if configuration pin 508 is set to a logical high value, then master SPI block 302 may be disabled and configuration data may be loaded from non-volatile memory 106 into configuration memory 114 when PLD 100 is powered on. If configuration pin 508 is set to a logical low value, then configuration data may be loaded into configuration memory 114 through master SPI interface block 302 or slave SPI interface block 304 of data port 112(1), or through data port 112(2) (e.g., JTAG port) when PLD 100 is powered on.

In another embodiment, PLD 100 may further include another configuration pin 510 (labeled CFG1) which, in combination with configuration pin 508, may determine the particular boot sequence performed by PLD 100. In one embodiment, configuration pin 508 may be implemented as

TABLE 1

| Data Port 112(1) | Pins Behavior | | | | |
| --- | --- | --- | --- | --- | --- |
| (SPI Interface) | CCLK | CSSPIN | CSSPISN | SISPI | SOSPI | Applications |
| Master | Output | Output | User I/O | Output | Input | Clock data out of SPI device to boot up FPGA |
| Slave | Input | User I/O | Input | Input | Output | Access SRAM fuses and Flash fuses in FPGA |

For example, when data port 112(1) is operated in master mode, configuration data can be received from external non-volatile memory 524 and programmed into configuration memory 114. In this mode, the CCLK, CSSPIN, and SISPI pins operate as outputs to provide clock, master chip select, and data output signals, respectively to external non-volatile memory 524. In addition, the SOSPI pin operates as a data input to receive data input signals (e.g., configuration data) from external non-volatile memory 524. As also shown in Table 1, the CSSPISN pin remains available to be used as a user I/O pin by PLD 100.

When data port 112(1) is operated in slave mode, configuration data can be received from external non-volatile memory 524 or CPU or master SPI device 534 to be programmed into configuration memory 114 or non-volatile memory 106 as previously described herein. In this mode, the CCLK, CSSPISN, and SISPI pins operate as inputs to receive clock, slave chip select, and data input signals (i.e., configuration data), respectively. In addition, the SOSPI pin provides data output signals. As also indicated in Table 1, the CSSPIN pin remains available to be used as a user I/O pin by PLD 100 while in slave mode.

a dedicated pin and configuration pin 510 may be implemented as a shared pin (i.e., may be recovered as a user I/O pin). Table 2 below identifies the corresponding boot modes of PLD 100 as determined by exemplary signal values applied to configuration pins 508 and 510.

TABLE 2

| Configuration Mode | First Boot | Second Boot | CFG0 | CFG1 |
| --- | --- | --- | --- | --- |
| Dual Boot Mode | SPI | Internal Flash | 0 | 0 |
| | Internal Flash | SPI | 0 | 1 |
| Self Download Mode (SDM) | Internal Flash | N/A | 1 | X |
| 1149.1 TAP | N/A | N/A | X | X |

For example, if both of configuration pins 508 and 510 are set to logical low values when PLD 100 is powered on (i.e., when a power-on-reset operation is performed), PLD 100 may first attempt to boot from external non-volatile memory 524 through data port 112(1) and, if the first boot attempt is unsuccessful, then PLD 100 may attempt to boot from non-volatile memory 106. It will be appreciated from Table 2 above that this order may be reversed if configuration pin 510 is set to a logical high value. In addition, a single attempt to boot from non-volatile memory 106 will be made if configuration pin 508 is set to a logical high value. As also set forth in Table 2, the values of configuration pins 508 and 510 do not bear upon the booting of PLD 100 from data port 112(2) when under JTAG control.

In view of the present disclosure, it will be appreciated that a programmable logic device having for example one or more data ports supporting a convenient programming interface (an SPI port) can provide a variety of flexible options for loading configuration data into onboard memory, such as non-volatile flash memory and SRAM memory cells. It will further be appreciated that a programmable logic device implemented in accordance with one or more of the embodiments described herein allows an SPI interface block, used to support a programming interface (e.g., a data port), to also support user-defined operation.

Embodiments described above illustrate but do not limit the invention. It should also be understood that numerous modifications and variations are possible in accordance with the principles of the present invention. Accordingly, the scope of the invention is defined only by the following claims.

We claim:

1. A programmable logic device (PLD) comprising:
   volatile memory adapted to store configuration data to configure the PLD for its intended function;
   non-volatile memory adapted to store configuration data which is transferable to the volatile memory to configure the PLD for its intended function;
   a serial peripheral interface (SPI) port adapted to receive configuration data from an external device for transfer into one of the volatile memory and the non-volatile memory;
   a master SPI interface block adapted to transfer configuration data from the external device through the SPI port to the volatile memory; and
   a slave SPI interface block adapted to transfer configuration data from the external device through the SPI port to the volatile memory or the non-volatile memory.

2. The programmable logic device of claim 1, wherein the SPI port is a dedicated circuit.

3. The programmable logic device of claim 1, further comprising control logic adapted to selectively transfer configuration data from the non-volatile memory to the volatile memory and from the external device to the volatile memory in response to a power-on-reset operation.

4. The programmable logic device of claim 1, wherein configuration data is transferred from the SPI port to the volatile memory directly, to the non-volatile memory directly, and/or to the non-volatile memory via a background programming mode.

5. A programmable logic device (PLD) comprising:
   volatile memory adapted to store configuration data to configure the PLD for its intended function;
   non-volatile memory adapted to store configuration data which is transferable to the volatile memory to configure the PLD for its intended function;
   a serial peripheral interface (SPI) port adapted to receive configuration data from an external device for transfer into one of the volatile memory and the non-volatile memory;
   a slave SPI interface block;
   user logic adapted to provide a plurality of user signals;
   a plurality of input/output pins of the SPI port adapted to receive a plurality of external signals from the external device; and
   a multiplexer coupled at its input to the input/output pins of the SPI port and to the user logic and coupled at its output to the slave SPI interface block, the multiplexer adapted to selectively provide the slave SPI interface block with one of the user signals and the external signals.

6. The programmable logic device of claim 5, wherein the user signals are adapted to program one of the volatile memory and the non-volatile memory through the slave SPI interface block.

7. A programmable logic device (PLD) comprising:
   volatile memory adapted to store configuration data to configure the PLD for its intended function;
   non-volatile memory adapted to store configuration data which is transferable to the volatile memory to configure the PLD for its intended function;
   a serial peripheral interface (SPI) port adapted to receive configuration data from an external device for transfer into one of the volatile memory and the non-volatile memory;
   a master SPI interface block adapted to transfer configuration data from the external device through the SPI port to the volatile memory;
   a slave SPI interface block adapted to transfer configuration data from the external device through the SPI port to the volatile memory or the non-volatile memory;
   user logic adapted to provide a plurality of user signals;
   a plurality of input/output pins of the SPI port adapted to receive a plurality of external signals from the external device; and
   a multiplexer coupled at its input to the input/output pins of the SPI port and to the user logic and coupled at its output to the slave SPI interface block, the multiplexer adapted to selectively provide the slave SPI interface block with one of the user signals and the external signals in response to a programmable fuse.

8. The programmable logic device of claim 1, wherein the external device is an SPI flash device adapted to interface with the SPI port, wherein the volatile memory comprises static random access memory, and wherein the non-volatile memory comprises flash memory.

9. The programmable logic device of claim 1, further comprising a JTAG port adapted to receive configuration data for transfer into the volatile memory or the non-volatile memory.

10. A method of configuring a programmable logic device, the method comprising:
    providing a serial peripheral interface (SPI) port adapted to receive configuration data from an external device;
    providing non-volatile memory adapted to receive the configuration data from the SPI port and store the configuration data;
    providing volatile memory adapted to receive the configuration data from one of the SPI port and the non-volatile memory and to configure the programmable logic device for its intended function based on the configuration data;
    providing a clock signal from the SPI port to the external device; and
    receiving the configuration data at the SPI port from the external device.

11. The method of claim 10, wherein the SPI port is a dedicated circuit.

12. The method of claim 10, further comprising selectively transferring the configuration data from the non-volatile memory to the volatile memory and from the external device to the volatile memory in response to a power-on-reset operation.

13. A method of configuring a programmable logic device, the method comprising:
providing a serial peripheral interface (SPI) port adapted to receive configuration data from an external device;
providing non-volatile memory adapted to receive the configuration data from the SPI port and store the configuration data;
providing volatile memory adapted to receive the configuration data from one of the SPI port and the non-volatile memory and to configure the programmable logic device for its intended function based on the configuration data;
receiving a clock signal at the SPI port from the external device; and
receiving the configuration data at the SPI port from the external device.

14. The method of claim 10, further comprising transferring the configuration data from the SPI port directly to the volatile memory, directly to the non-volatile memory directly, and/or to the non-volatile memory via a background programming mode.

15. The method of claim 10, further comprising:
providing a plurality of user signals;
receiving a plurality of external signals from the external device through the SPI port; and
selectively providing one of the user signals and the external signals to a slave SPI interface block, wherein the user signals are adapted to program one of the volatile memory and the non-volatile memory through the slave SPI interface block.

16. A programmable logic device (PLD) comprising:
volatile memory adapted to store configuration data to configure the PLD for its intended function;
non-volatile memory adapted to store configuration data;
means for receiving configuration data from an external serial peripheral interface (SPI) device;
means for transferring received configuration data into one of the volatile memory and the non-volatile memory;
means for transferring configuration data from the non-volatile memory to the volatile memory; and
means for selectively transferring configuration data from the non-volatile memory to the volatile memory and from the external device to the volatile memory in response to a power-on-reset operation.

17. The programmable logic device of claim 5, wherein configuration data is transferred from the SPI port to the volatile memory directly, to the non-volatile memory directly, and/or to the non-volatile memory via a background programming mode.

18. The programmable logic device of claim 5, wherein the external device is an SPI flash device adapted to interface with the SPI port, wherein the volatile memory comprises static random access memory, and wherein the non-volatile memory comprises flash memory.

19. The programmable logic device of claim 7, wherein configuration data is transferred from the SPI port to the volatile memory directly, to the non-volatile memory directly, and/or to the non-volatile memory via a background programming mode.

20. The programmable logic device of claim 7, wherein the external device is an SPI flash device adapted to interface with the SPI port, wherein the volatile memory comprises static random access memory, and wherein the non-volatile memory comprises flash memory.

* * * * *

UNITED STATES PATENT AND TRADEMARK OFFICE
CERTIFICATE OF CORRECTION

| | | |
|---|---|---|
| PATENT NO. | : 7,378,873 B1 | |
| APPLICATION NO. | : 11/446548 | |
| DATED | : May 27, 2008 | |
| INVENTOR(S) | : Howard Tang et al. | |

It is certified that error appears in the above-identified patent and that said Letters Patent is hereby corrected as shown below:

The title page should be deleted and substitute therefor the attached title page.

Drawings:

Delete drawing sheets Figs 1-5 and substitute therefor the drawing sheets, consisting of Figs. 1-5 as shown on the attached pages.

Signed and Sealed this

Twenty-sixth Day of May, 2009

JOHN DOLL
*Acting Director of the United States Patent and Trademark Office*

(12) United States Patent
Tang et al.

(10) Patent No.: US 7,378,873 B1
(45) Date of Patent: May 27, 2008

(54) PROGRAMMABLE LOGIC DEVICE PROVIDING A SERIAL PERIPHERAL INTERFACE

(75) Inventors: Howard Tang, San Jose, CA (US); Om P. Agrawal, Los Altos, CA (US); David L. Rutledge, Hillsboro, OR (US); Fabiano Fontana, San Jose, CA (US)

(73) Assignee: Lattice Semiconductor Corporation, Hillsboro, OR (US)

(*) Notice: Subject to any disclaimer, the term of this patent is extended or adjusted under 35 U.S.C. 154(b) by 42 days.

(21) Appl. No.: 11/446,548

(22) Filed: Jun. 2, 2006

(51) Int. Cl.
  *H01L 25/00* (2006.01)
  *H03K 19/177* (2006.01)
(52) U.S. Cl. .................... 326/41; 326/38; 326/40
(58) Field of Classification Search .......... 326/38–41
  See application file for complete search history.

(56) References Cited

U.S. PATENT DOCUMENTS

| | | | |
|---|---|---|---|
| 5,548,228 A | 8/1996 | Madurawe |
| 5,640,107 A | 6/1997 | Kruse |
| 5,689,516 A | 11/1997 | Mack et al. |
| 5,696,455 A | 12/1997 | Madurawe |
| 5,794,033 A | 8/1998 | Aldebert |
| 6,038,185 A | 3/2000 | Ng |
| 6,044,025 A | 3/2000 | Lawman |
| 6,049,222 A | 4/2000 | Lawman |
| 6,150,837 A | 11/2000 | Beal et al. |
| 6,304,099 B1 | 10/2001 | Tang et al. |
| 6,356,107 B1 | 3/2002 | Tang et al. |
| 6,467,009 B1 | 10/2002 | Winegarden et al. |
| 6,483,342 B2 | 11/2002 | Britton et al. |
| 6,507,214 B1 | 1/2003 | Snyder |
| 6,538,468 B1 | 3/2003 | Moore |
| 6,564,285 B1 | 5/2003 | Mills |
| 6,704,850 B1 | 3/2004 | Reynolds |
| 6,714,041 B1 | 3/2004 | Darling et al. |
| 6,721,840 B1 | 4/2004 | Allegrucci |
| 6,732,263 B1 | 5/2004 | May et al. |
| 6,772,230 B2 | 8/2004 | Chen et al. |
| 6,774,668 B1 | 8/2004 | Wirtz, II |
| 6,785,165 B2 | 8/2004 | Kawahara |
| 6,828,823 B1 | 12/2004 | Tsui et al. |
| 6,851,047 B1 | 12/2004 | Tsui et al. |

(Continued)

OTHER PUBLICATIONS

Serial Peripheral Interface Bus—Wikipedia, the free encyclopedia, Jan. 6, 2007, p. 1-7.

(Continued)

*Primary Examiner*—Anh Q. Tran
(74) *Attorney, Agent, or Firm*—MacPherson Kwok Chen & Heid LLP; Brent A. Folsom

(57) ABSTRACT

Systems and methods are disclosed herein to provide an improved approach to the configuration of integrated circuits such as programmable logic devices (PLDs). For example, in accordance with one embodiment of the present invention, a PLD includes volatile memory adapted to store configuration data to configure the PLD for its intended function. The PLD further includes non-volatile memory adapted to store configuration data which is transferable to the volatile memory to configure the PLD for its intended function. The PLD further includes a serial peripheral interface (SPI) port adapted to receive configuration data from an external device for transfer into one of the volatile memory and the non-volatile memory.

20 Claims, 5 Drawing Sheets

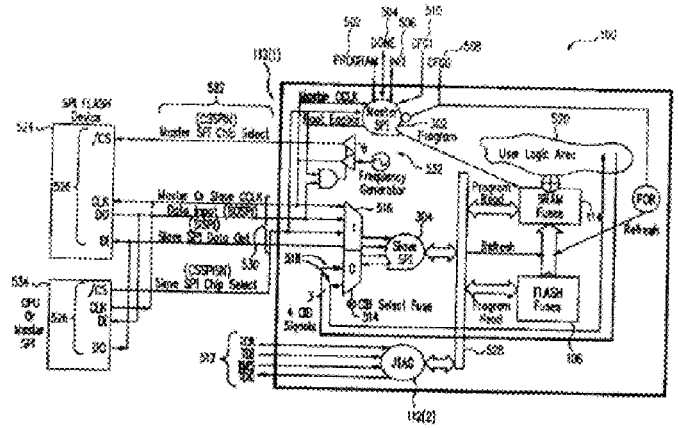

UNITED STATES PATENT AND TRADEMARK OFFICE
CERTIFICATE OF CORRECTION

PATENT NO.        : 7,378,873 B1                                Page 3 of 7
APPLICATION NO.   : 11/446548
DATED             : May 27, 2008
INVENTOR(S)       : Howard Tang et al.

It is certified that error appears in the above-identified patent and that said Letters Patent is hereby corrected as shown below:

Replace sheet 1 of 5 with the following drawing:

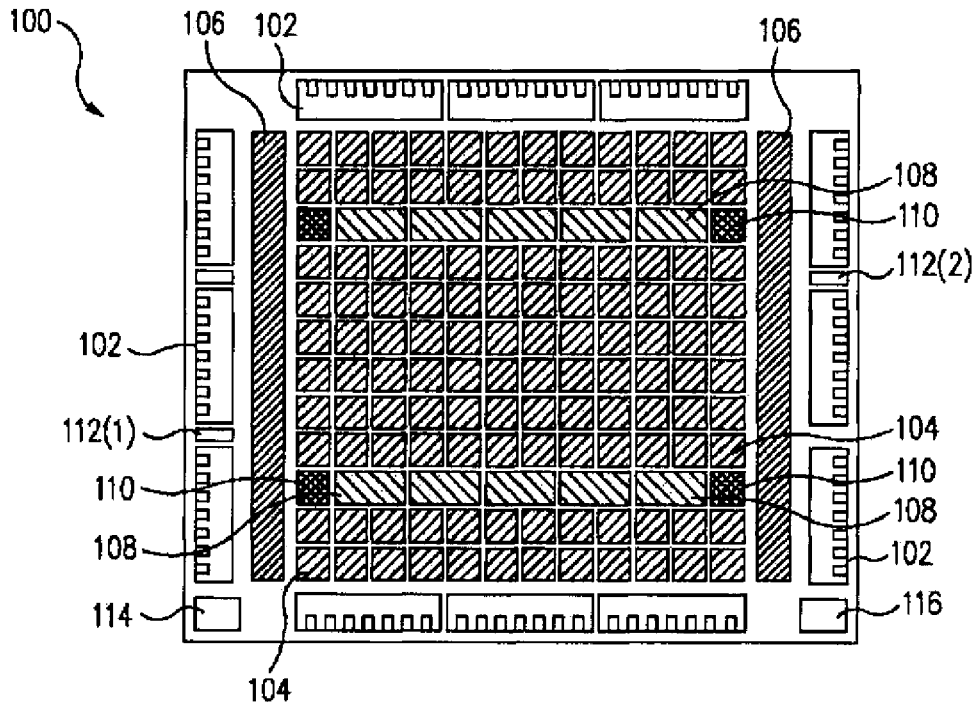

FIG. 1

UNITED STATES PATENT AND TRADEMARK OFFICE
CERTIFICATE OF CORRECTION

| | | |
|---|---|---|
| PATENT NO. | : 7,378,873 B1 | Page 4 of 7 |
| APPLICATION NO. | : 11/446548 | |
| DATED | : May 27, 2008 | |
| INVENTOR(S) | : Howard Tang et al. | |

It is certified that error appears in the above-identified patent and that said Letters Patent is hereby corrected as shown below:

Replace sheet 2 of 5 with the following drawing:

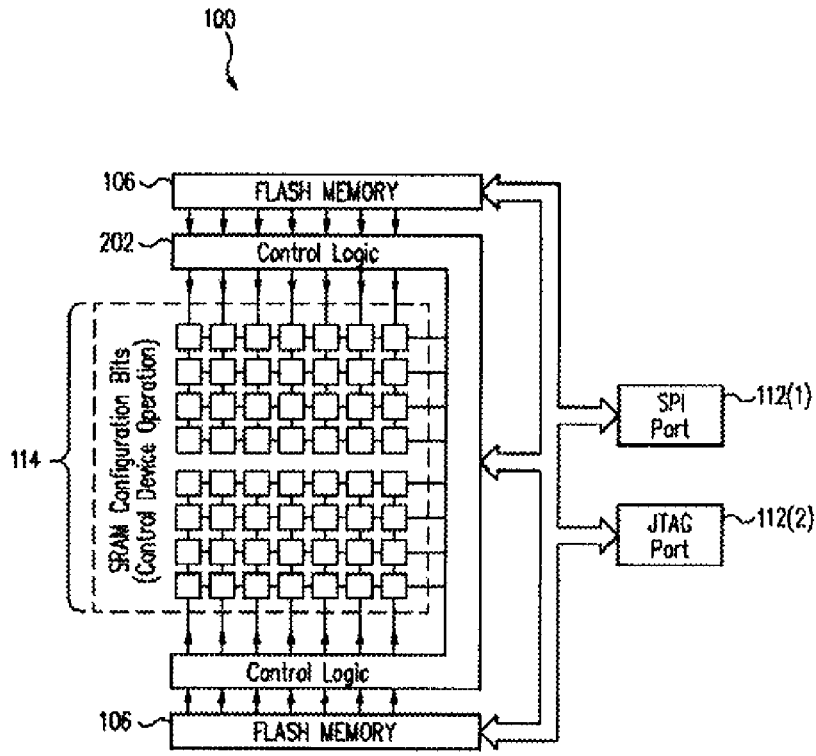

FIG. 2

UNITED STATES PATENT AND TRADEMARK OFFICE
CERTIFICATE OF CORRECTION

| | | |
|---|---|---|
| PATENT NO. | : 7,378,873 B1 | Page 5 of 7 |
| APPLICATION NO. | : 11/446548 | |
| DATED | : May 27, 2008 | |
| INVENTOR(S) | : Howard Tang et al. | |

It is certified that error appears in the above-identified patent and that said Letters Patent is hereby corrected as shown below:

Replace sheet 3 of 5 with the following drawing:

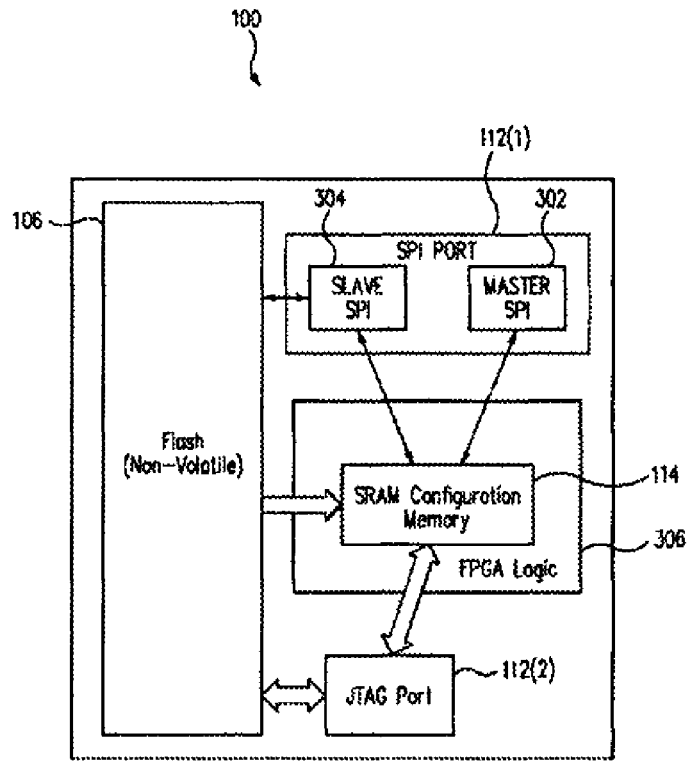

FIG. 3

UNITED STATES PATENT AND TRADEMARK OFFICE
CERTIFICATE OF CORRECTION

| | | |
|---|---|---|
| PATENT NO. | : 7,378,873 B1 | Page 6 of 7 |
| APPLICATION NO. | : 11/446548 | |
| DATED | : May 27, 2008 | |
| INVENTOR(S) | : Howard Tang et al. | |

It is certified that error appears in the above-identified patent and that said Letters Patent is hereby corrected as shown below:

Replace sheet 4 of 5 with the following drawing:

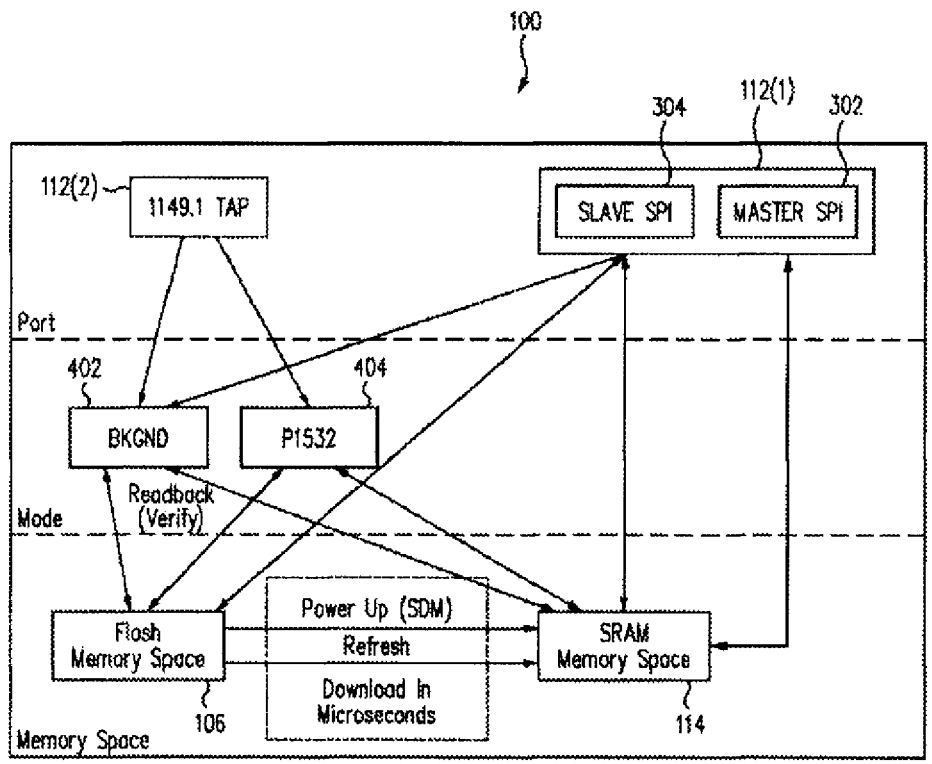

FIG. 4

UNITED STATES PATENT AND TRADEMARK OFFICE
CERTIFICATE OF CORRECTION

| | | |
|---|---|---|
| PATENT NO. | : 7,378,873 B1 | Page 7 of 7 |
| APPLICATION NO. | : 11/446548 | |
| DATED | : May 27, 2008 | |
| INVENTOR(S) | : Howard Tang et al. | |

It is certified that error appears in the above-identified patent and that said Letters Patent is hereby corrected as shown below:

Replace sheet 5 of 5 with the following drawing:

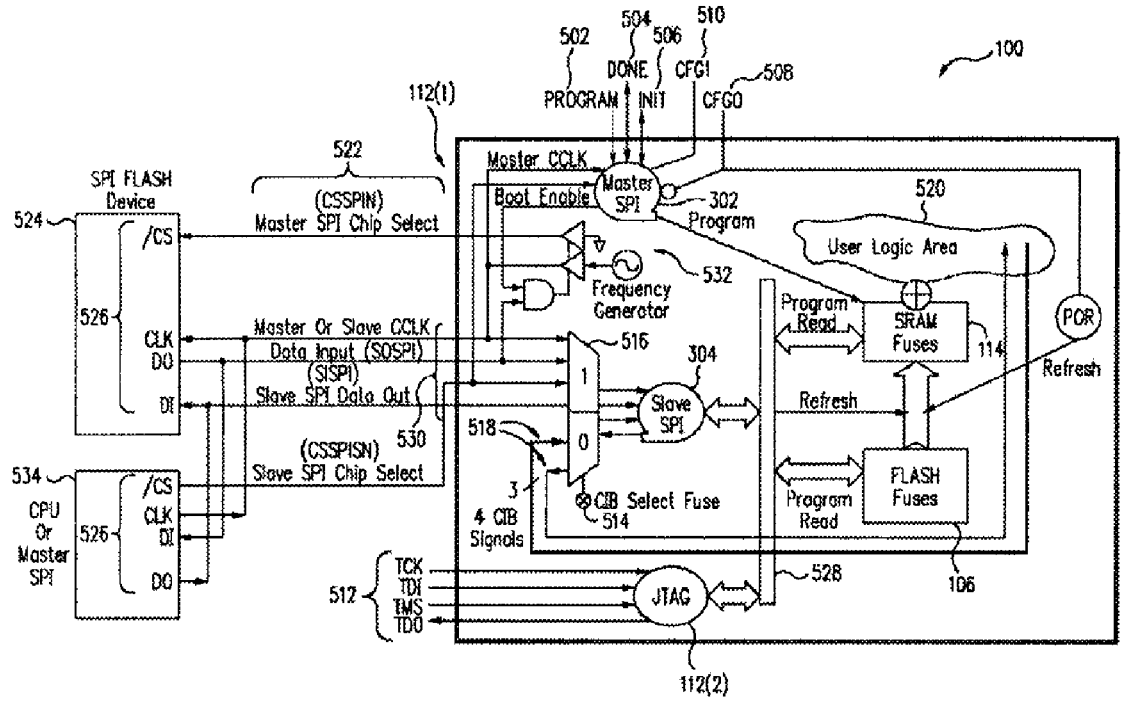

FIG. 5